(12) United States Patent
Kim

(10) Patent No.: US 7,572,696 B2
(45) Date of Patent: Aug. 11, 2009

(54) METHOD OF FORMING A GATE OF A FLASH MEMORY DEVICE

(75) Inventor: Dong-Oog Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 349 days.

(21) Appl. No.: 11/320,335

(22) Filed: Dec. 29, 2005

(65) Prior Publication Data
US 2006/0160308 A1 Jul. 20, 2006

(30) Foreign Application Priority Data
Dec. 30, 2004 (KR) ................ 10-2004-0117151

(51) Int. Cl.
*H01L 21/336* (2006.01)
(52) U.S. Cl. ............... 438/257; 257/E21.68
(58) Field of Classification Search .......... 438/197, 438/201, 257
See application file for complete search history.

(56) References Cited
U.S. PATENT DOCUMENTS

| | | | | |
|---|---|---|---|---|
| 5,505,816 A | * | 4/1996 | Barnes et al. | 438/695 |
| 6,004,829 A | * | 12/1999 | Chang et al. | 438/16 |
| 6,153,904 A | * | 11/2000 | Yang | 257/316 |
| 6,177,318 B1 | * | 1/2001 | Ogura et al. | 438/267 |
| 6,479,346 B1 | * | 11/2002 | Yi et al. | 438/257 |
| 2003/0134472 A1 | * | 7/2003 | Yang | 438/257 |
| 2004/0056316 A1 | * | 3/2004 | Prall et al. | 257/390 |
| 2005/0070067 A1 | * | 3/2005 | Kim | 438/257 |
| 2005/0130433 A1 | * | 6/2005 | Dong et al. | 438/701 |
| 2005/0287741 A1 | * | 12/2005 | Ding | 438/257 |

* cited by examiner

*Primary Examiner*—Lex Malsawma
(74) *Attorney, Agent, or Firm*—Sherr & Vaughn, PLLC

(57) ABSTRACT

The present invention provides a method of forming a gate in a flash memory device. The method includes: forming a oxide layer on a semiconductor substrate; forming a stacked structure including a tunnel oxide layer, a floating gate, a dielectric layer, and a control gate by patterning them on the semiconductor substrate; exposing portions of the semiconductor substrate below the field oxide layer by selectively etching the field oxide layer adjacent to the source region in order to form a common source; performing subsequent etching for removing oxides between the control gates; and forming an oxide layer covering the semiconductor substrate and both sidewalls of the floating gate and control gate.

5 Claims, 4 Drawing Sheets

METHOD OF FORMING A GATE OF A FLASH MEMORY DEVICE

CROSS-REFERENCE TO RELATED APPLICATION

This application claims priority to and the benefit of Korean Patent Application No. 10-2004-0117151 filed in the Korean Intellectual Property Office on Dec. 30, 2004, the entire contents of which are incorporated herein by reference.

BACKGROUND OF THE INVENTION (a) Field of the Invention

The present invention relates to a method of forming a gate in a flash memory device, and more particularly, to a method of forming a gate in a flash memory device having advantages of enhancing an operation speed of a device by reducing resistance of a word line.

(b) Description of the Related Art

A NOR type of flash memory device is a non-volatile memory device having a floating gate and a control gate in its stacked structure. A stacked structure including a floating gate and a control gate is formed in a dual conductive polysilicon structure. The stacked structure is formed on a tunnel oxide layer. An ONO (Oxide—Nitride—Oxide) layer used as a dielectric layer is formed between a floating gate and a control gate. The ONO layer performs a function of a capacitor. A bias applied at a control gate can be applied at a floating gate through an ONO layer. A program operation and an erase operation for a flash memory device are performed by using a relatively high bias.

FIG. 1 is a top plan view showing a common source region of a conventional memory device. FIG. 2 is a cross-sectional view showing a method of forming a gate in a flash memory device.

Referring to FIG. 1, according to a conventional NOR flash memory device, a word line 20 is formed so as to cross a field oxide layer 17 defining an active region 11, and the word line 20 crosses a bit line. A single cell is formed at a crossing point between the word line 20 and the bit line. In addition, a bit line contact 31 and a drain contact are formed at an end of the active region 11.

The word line 20 adjacent to the bit line contact 31 has a different width from the word line 20 adjacent to a common source 15. The common source 15 has a single source contact for 16 cells. The common source 15 for 16 cells is connected with an $N^+$ diffusion region.

In addition, STI (Shallow Trench Isolation) is used for isolation technology for a semiconductor device having a scale of 0.25 μm or 0.18 μm, and a self-aligned floating gate is formed in patterning a control gate in order to reduce a cell size of a semiconductor device having a scale of 0.35 μm or less. Even if STI and a self-aligned floating gate are used for reducing a cell size, resistance of a common source may be multiply increased by simultaneously using the STI and self-aligned floating gate.

Moreover, in a case that common source etching is used among several schemes for forming a common source, an oxide layer may be formed for stabilizing a gate after forming the common source. However, such an oxide layer may be non-uniformly formed due to plasma used in the common-source etching.

Referring to FIG. 2, according to a conventional method of forming a gate in a flash memory device, a field oxide layer 17 is formed on a semiconductor substrate by using STI. Subsequently, a tunnel oxide layer 22, a floating gate 21, a dielectric layer 24, and a control gate 25 are formed on a semiconductor substrate 10. In addition, when the control gate 25 is patterned, a self-aligned floating gate is also patterned.

After performing etching for patterning a gate 20, common source etching is performed in order to form the common source 15. The common source etching is performed for forming a trench 14 by selectively removing the field oxide layer 17 exposed by the gate 20 such that the semiconductor substrate 10 below the field oxide layer 17 is exposed by the trench 14.

Subsequently, the common source 15 is formed by forming a junction, such as an $N^+$ diffusion layer, through ion implantation. The common source 15 performs a function of connecting between source regions of the device. Such common source etching is performed by using a SAS (Self Aligned Source) scheme. After forming the common source 15, an oxide layer 27 covering sidewalls of the gate 20 is formed through an oxidization or/and deposition process in order to stabilize the gate 20.

However, the oxide layer 27 may be non-uniformly formed due to plasma used in the common source etching. For example, the oxide layer 27 may have different thicknesses at sidewalls of the gate 20. More particularly, as shown in FIG. 2, a portion 41 of the oxide layer 27 may be formed with a relatively smaller thickness at the trench 14 for the common source 15 than a portion 43 of the oxide layer 27.

Such a non-uniform thickness of the oxide layer 27 may induce several problems. For example, resistance of the gate 20 may be undesirably increased due to the non-uniform thickness of the oxide layer 27. In addition, unstable electrons which are gathered in the floating gate 21 after programming a flash cell may escape through the portion 41 of the oxide layer 27 having the small thickness.

Moreover, a current ETOX (EEPROM Tunnel Oxide) type of device has the control gate 25 and the floating gate 21 in its dual polysilicon structure, and characteristics of such a flash memory device are determined by an erasing operation and a program operation. When a predetermined voltage is applied at a control gate, such a flash memory device may have a voltage applied at a floating gate through an ONO (Oxide-Nitride-Oxide) capacitor in a dielectric layer by using a coupling ratio.

At this time, since a plurality of cells 13 are formed in a single word line (referring to 20 in FIG. 1), the resistance of the gate 20 which composes the word line 20 may affect a current ($I_R$) drop. Therefore, an undesired increase of the resistance of the gate 20 may induce the characteristic degradation of a flash memory device.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method of forming a gate in a flash memory device having advantages of enhancing the operation speed of the flash memory device by reducing resistance of the word line.

An exemplary method of forming a gate in a flash memory device according to an embodiment of the present invention includes: forming a field oxide layer on a semiconductor substrate; forming a stacked structure including a tunnel oxide layer, a floating gate, a dielectric layer, and a control gate by patterning them on the semiconductor substrate; exposing portions of the semiconductor substrate below the field oxide layer by selectively etching the field oxide layer adjacent to the source region in order to form a common source; performing subsequent etching for removing oxides between the control gates; and forming an oxide layer covering the semiconductor substrate and both sidewalls of the floating gate and the control gate.

Before performing the subsequent etching, an N+ diffusion layer may be formed by ion implantation so as to form a common source on the etched field oxide layer.

The subsequent etching may be performed by isotropic dry etching, and the subsequent etching may be performed by using a reaction gas including carbon tetrafluoride ($CF_4$) gas and nitrogen gas ($N_2$).

The forming of the oxide layer may be performed by RTA (Rapid Thermal Annealing) at a temperature of about 1050° C.

According to an exemplary embodiment of the present invention, the operation speed of the flash memory device may be enhanced by reducing resistance of the word line.

DETAILED DESCRIPTION OF THE EMBODIMENTS

Figure 1:
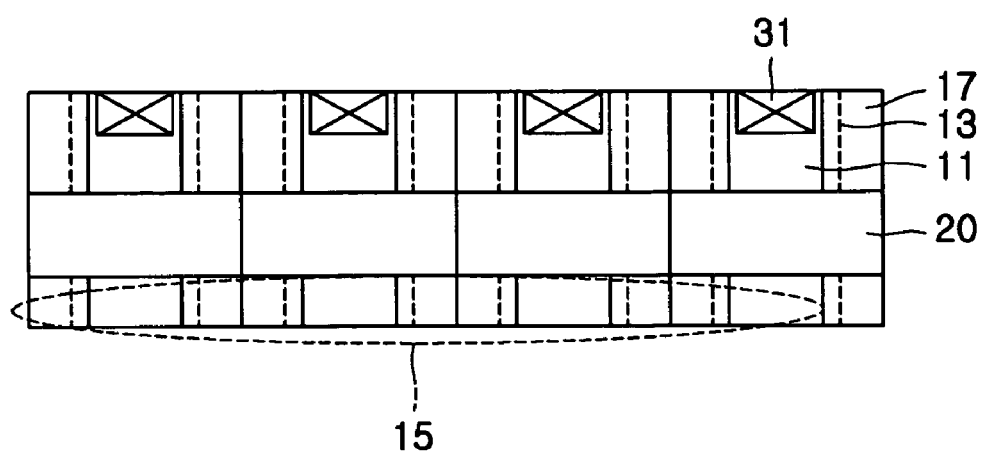
FIG. 1 is a drawing showing a common source region in a conventional flash memory device.
Figure 2:
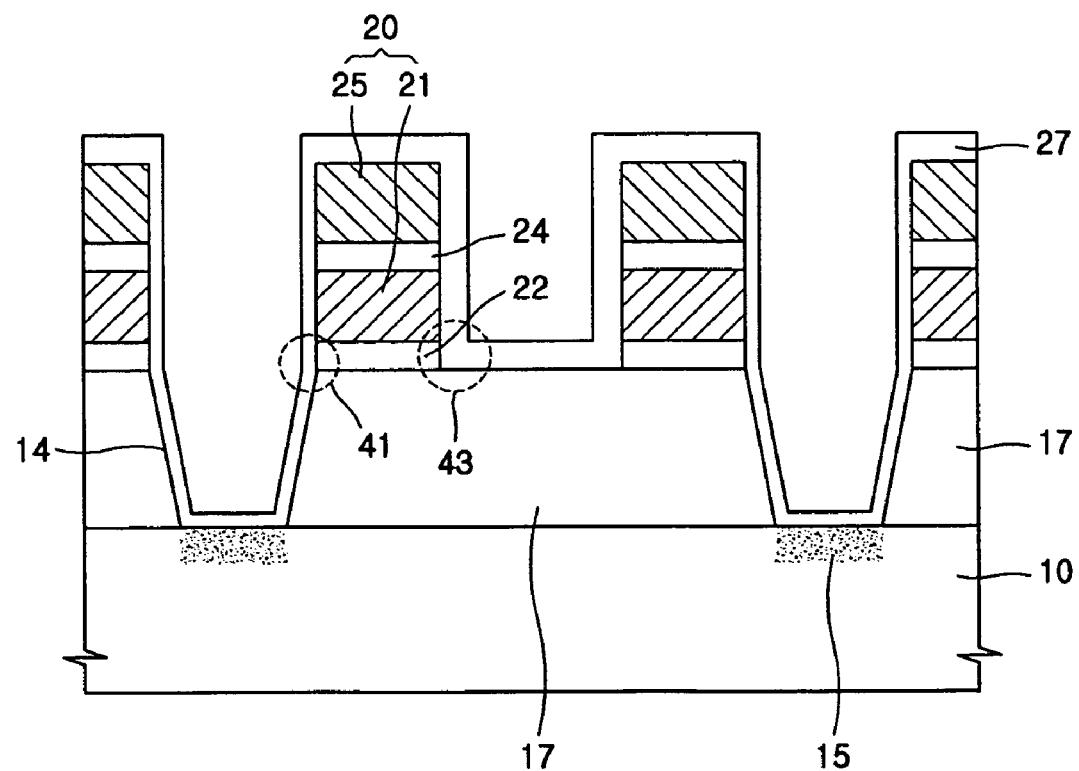
FIG. 2 is a cross-sectional view showing a conventional method of forming a gate in a flash memory device.

With reference to the accompanying drawings, the present invention will be described in order for those skilled in the art to be able to implement the invention. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

According to an exemplary embodiment of the present invention, in order to enhance operation characteristics of an NOR flash memory device such as an ETOX (EEPROM Tunnel Oxide) memory cell, a control gate fabrication process is performed as follows.

As in the conventional method, gate patterning is firstly performed and then a common source is formed between gates by etching a field oxide layer exposed by the gate pattern in an SAS technique.

Subsequently, according to an exemplary embodiment of the present invention, in order to enable the oxide layer to be uniform over the gates, the patterned gates are further etched after etching the field oxide layer formed between the gates and prior to forming an oxide layer for stabilizing the gates.

More particularly, a surface of a gate that has become unstable as a result of plasma is stabilized by an isotropic etching process with the use of a reaction gas including carbon tetrafluoride ($CF_4$) gas and nitrogen gas ($N_2$). Such stabilizing of the gate is hereinafter called a SAS PET (self-aligned source post-etch treatment).

Since the surface and sidewalls of the gate may be stabilized, resistance of the gate may be effectively reduced. In addition, unstable electrons which are gathered in the floating gate after programming a NOR flash memory device may not escape through the oxide layer.

Figure 3:
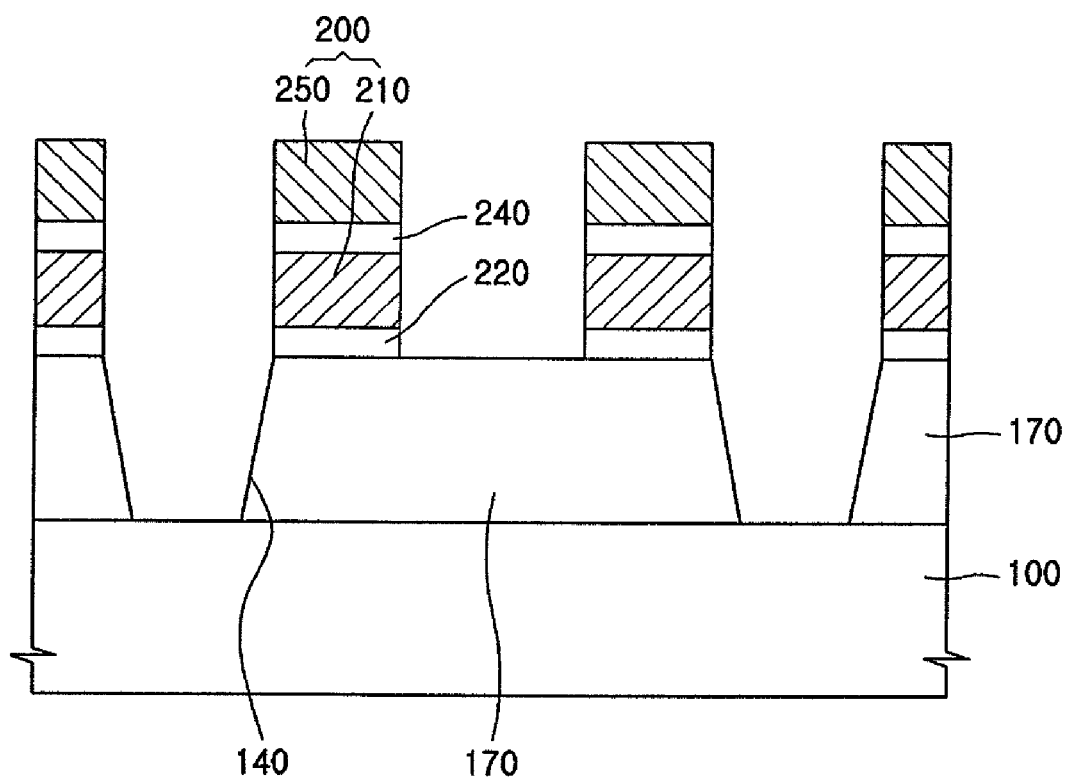
FIG. 3 to FIG. 5 are cross-sectional views showing a method of forming a gate in a flash memory device according to an exemplary embodiment of the present invention.
Figure 4:
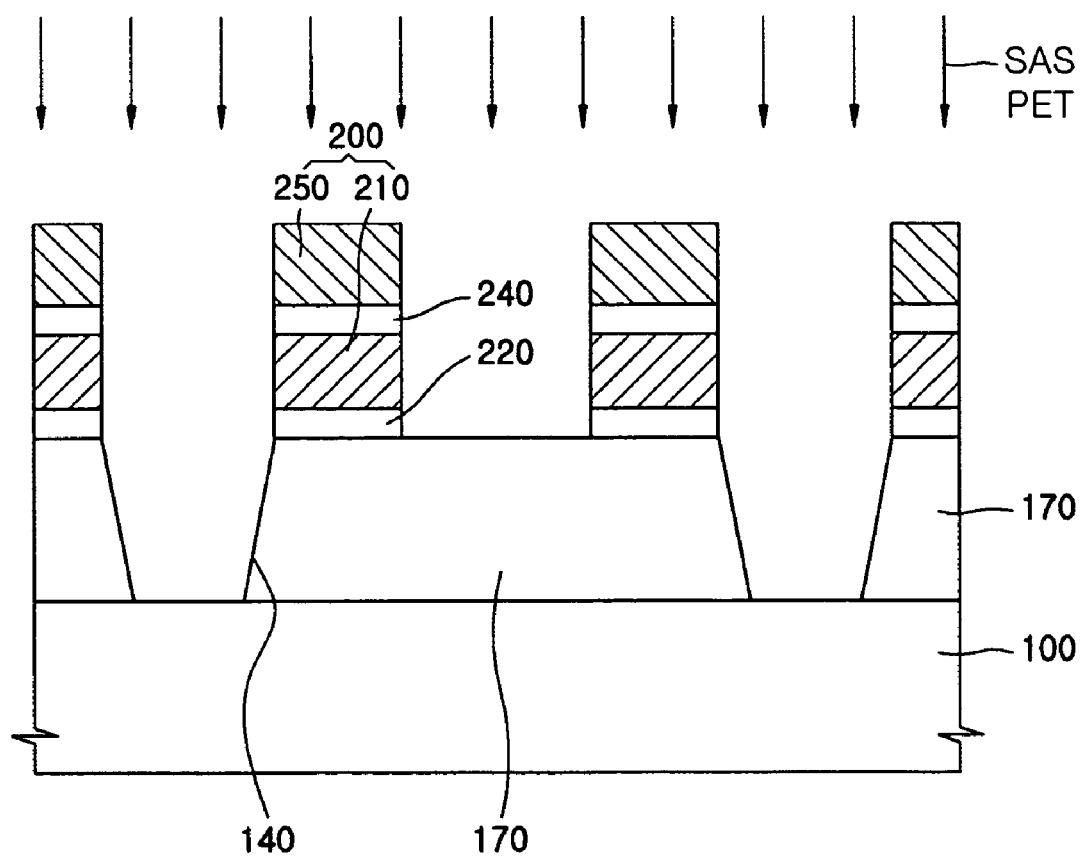
Figure 5:
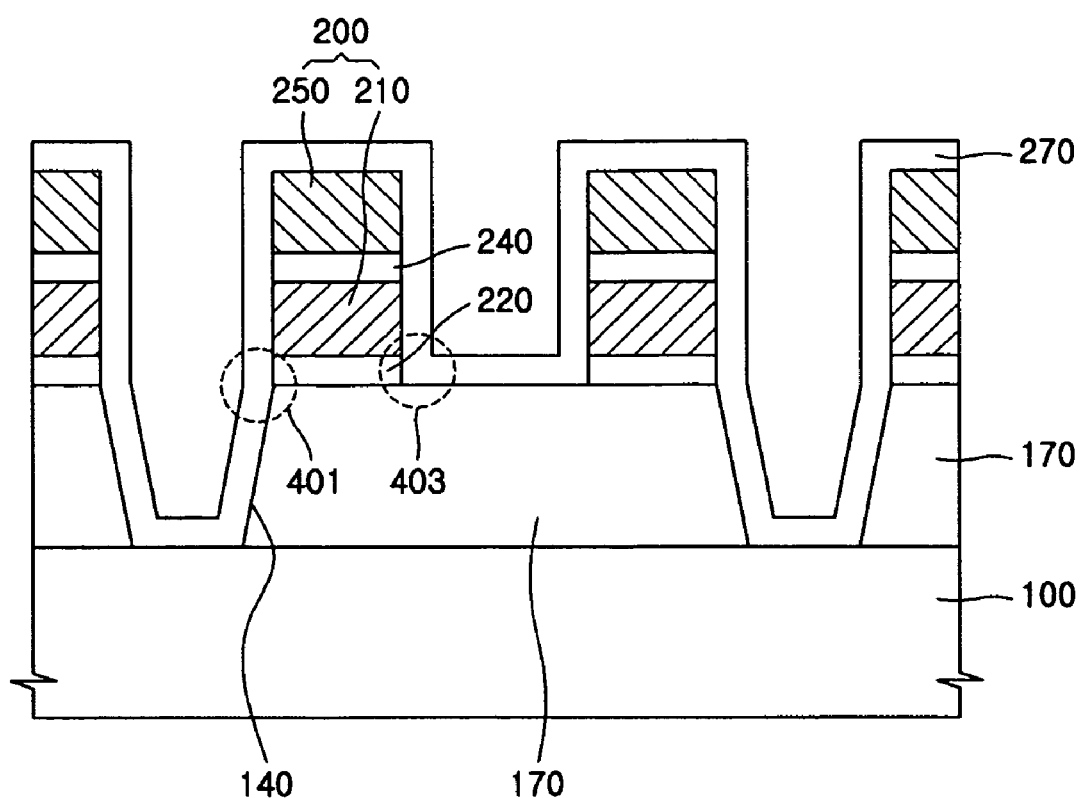

FIG. 3 to FIG. 5 are cross-sectional views showing a method of forming a gate in a flash memory device according to an exemplary embodiment of the present invention.

Referring to FIG. 3, an oxide layer, a nitride layer, and a TEOS layer are sequentially deposited on a semiconductor substrate 100, such as a silicon wafer, and they are then etched using a mask which differentiates between an active region and a field region.

Subsequently, an STI region is formed by performing an oxidization process for a buffer layer and a filling process with the use of HDP-USG (High Density Plasma—Undoped Silicate Glass). Thereafter, a field oxide layer 170 is formed by performing a planarization process, and then a well and a junction are formed.

Subsequently, a tunnel oxide layer 220 and floating gate layer 210 are deposited, and they are then etched by using a mask. Thereafter, an ONO layer 240 used as a dielectric layer and a control gate layer 250 are sequentially deposited.

At this time, before forming the control gate layer 250, the ONO layer 240, the floating gate layer 210, and the tunnel oxide layer 220 which are formed in the region other than in a flash cell, are selectively removed by etching with the use of a mask.

Subsequently, the control gate layer 250 is patterned by etching with the use of a mask.

Consequently, as shown in FIG. 3, a stacked structure including the tunnel oxide layer 220, the floating gate 210, the dielectric layer 240, and the control gate 250 is formed.

After forming the control gate 250, a cleaning process and an ashing process are performed in order to remove polymers created in the above-mentioned etching process.

Subsequently, as shown in FIG. 3, a trench 140 is formed by selectively removing the field oxide layer 170 adjacent to a source region through an SAS scheme such that the semiconductor substrate 100 below the field oxide layer 170 is exposed. Then a common source is formed by forming a junction, such as an $N^+$ diffusion layer, through ion implantation. The common source performs a function of connecting between source regions of the device.

After forming the common source, an oxide layer covering sidewalls of a gate 200 is formed through an oxidization or/and deposition process in order to stabilize the gate 200.

However, according to an exemplary embodiment of the present invention, an SAS PET (Self Aligned Source Post Etch Treatment) is performed in order to prevent a non-uniform thickness of the oxide layer before forming the oxide layer.

Referring to FIG. 4, after performing etching for the field oxide layer 170 so as to form the common source, gate etching is additionally performed in order to remove remaining oxides between the gates 200.

Such gate etching may be understood as an SAS PET, and the SAS PET may stabilize unstable sidewalls and surfaces of the gates affected by plasma which is used for the etching process for patterning the gates 200 and for forming the common source.

More particularly, the SAS PET can be understood as a removing process for residues or remaining oxides created between the gates 200.

The SAS PET is performed by isotropic dry etching with the use of a reaction gas including carbon tetrafluoride ($CF_4$) gas and nitrogen gas ($N_2$). After stabilizing the gate 200 by the SAS PET, the oxide layer covering both sidewalls of the gate 200 is formed.

Referring to FIG. 5, the oxide layer covering the exposed portions of the semiconductor substrate 100 and both sidewalls of the gates 210 and 250 may be formed by performing RTA (Rapid Thermal Annealing) at a temperature of about 1050° C.

As shown in FIG. 5, an oxide layer 270 may be uniformly grown because it is composed of an oxide which is newly grown or deposited after removing or stabilizing the portions of the gate damaged by plasma.

Therefore, a portion 401 of the oxide layer 270 which is formed at the edge of the floating gate 210 and adjacent to the trench 140 for the common source may have the same thickness as another portion 403 of the oxide layer.

Therefore, resistance of the gate 200 may not be increased. More particularly, while resistance of a cell control gate which is formed without an SAS PET may be about 60 to 100 ohms or more per cell, resistance of a cell control gate which is formed by SAS PET may be about 20 to 40 ohms or less per cell.

Therefore, SAS PET according to an exemplary embodiment of the present invention may sharply reduce the resistance of the gate in a flash memory device. In addition, since the oxide layer 270 may have a uniform thickness, leakage currents may be reduced and retention characteristics of the flash memory device may be enhanced.

Consequently, according to an exemplary embodiment of the present invention, since resistances of word lines may be reduced, the operation speed of the flash memory device may be enhanced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a gate in a flash memory device, comprising:
    forming a field oxide layer on a semiconductor substrate; and then
    forming a stacked structure including a tunnel oxide layer, a floating gate, a dielectric layer, and a control gate on the semiconductor substrata including the field oxide layer by patterning them; and then
    forming a trench in order to form a common source by selectively etching the field oxide layer a source region to expose portions of the semiconductor substrata below the field oxide layer; and then
    performing subsequent etching for removing oxides after selectively etching the field oxide layer; and then
    forming an oxide layer having a uniform thickness coveting an inner wall of the trench, both sidewalls of the floating gate and the control gate, and upper portions of the control gate,
    wherein the subsequent etching is an isotropic dry etching.

2. The method of claim 1, further comprising, before performing the subsequent etching, forming a common source by forming an $N^+$ diffusion layer through ion implantation.

3. The method of claim 1, wherein the forming of the oxide layer is performed by RTA (Rapid Thermal Annealing) at a temperature of about 1050° C.

4. A method of forming a gate in a flash memory device comprising:
    forming a field oxide layer on a semiconductor substrate; and then
    forming a tunnel oxide layer, a floating gate, a dielectric layer, and a control gate on the semiconductor substrate including the field oxide layer; and then
    forming a trench in the field oxide layer; and then
    forming a common source in the semiconductor substrate by forming an $N^+$ diffusion layer;
    removing oxides after forming the trench by performing an isotropic dry etching process; and then
    forming an oxide layer having a uniform thickness covering sidewalls of the trench, sidewalls of the floating gate and the control gate, and upper portions of the control gate.

5. A method of forming a gate in a flash memory device comprising:
    forming a field oxide layer on a semiconductor substrate; and then
    forming a tunnel oxide layer, a floating gate, a dielectric layer, and a control gate on the semiconductor substrate including the field oxide layer; and then
    forming a trench in the field oxide layer exposing a portion of the semiconductor substrate in order to form a common source below the field oxide layer; and then
    removing oxides after forming the trench by performing a dry etching process using a reaction gas including carbon tetrafluoride ($CF_4$) gas and nitrogen gas ($N_2$); and then
    forming an oxide layer having a uniform thickness covering sidewalls of the trench, sidewalls of the floating gate and the control gate, and upper portions of the control gate.

* * * * *